US007692934B2

(12) United States Patent
Bartscher et al.

(10) Patent No.: US 7,692,934 B2
(45) Date of Patent: Apr. 6, 2010

(54) ASSEMBLING/DISASSEMBLING AND FIXING A PRINTED CIRCUIT BOARD

(75) Inventors: Bernd Bartscher, Wiesbaden (DE); Helmut Thoma, Mainz (DE)

(73) Assignee: Smiths Heimann GmbH, Wiesbaden (DE)

( * ) Notice: Subject to any disclaimer, the term of this patent is extended or adjusted under 35 U.S.C. 154(b) by 286 days.

(21) Appl. No.: 11/033,115

(22) Filed: Jan. 12, 2005

(65) Prior Publication Data
US 2005/0159020 A1 Jul. 21, 2005

(51) Int. Cl.
*H02B 1/01* (2006.01)
(52) U.S. Cl. ............... 361/825; 756/759; 756/807; 756/811
(58) Field of Classification Search ......... 361/756–759, 361/807–811; 439/326, 630
See application file for complete search history.

(56) References Cited

U.S. PATENT DOCUMENTS

| 3,701,071 | A | * | 10/1972 | Landman | ............... 200/5 R |
| 4,678,252 | A | * | 7/1987 | Moore | ............... 439/62 |
| 4,903,167 | A | * | 2/1990 | Lichtensperger | ............... 361/740 |
| 5,268,820 | A | | 12/1993 | Tseng et al. | |
| 6,234,820 | B1 | * | 5/2001 | Perino et al. | ............... 439/326 |
| 6,587,348 | B2 | * | 7/2003 | Kondo | ............... 361/741 |
| 6,711,024 | B1 | * | 3/2004 | Johansson et al. | ............... 361/760 |

FOREIGN PATENT DOCUMENTS

| DE | 75 26 707 U | 12/1975 |
| DE | 31 43 174 A1 | 5/1983 |
| DE | 31 21 967 A | 6/1983 |
| DE | 33 36 607 A1 | 4/1984 |
| DE | 85 08 344 U | 5/1985 |
| DE | 42 43 656 A1 | 5/1994 |

* cited by examiner

*Primary Examiner*—Tuan T Dinh
(74) *Attorney, Agent, or Firm*—Muncy, Giessler, Olds & Lowe, PLLC

(57) ABSTRACT

For assembling/disassembling a printed circuit board, a specially shaped spring is to be integrated inside the device. The assembly/disassembly of the printed circuit board in the device is simplified by virtue of the fact that the printed circuit board has to be pressed only against the spring and a fixed supporting part of the device to which the spring is attached. In order to be able to press the printed circuit board, among other things, perpendicularly against the fixed supporting part, the specially designed leg spring is fastened underneath the fixed supporting part. The legs of this spring protrude outward on both sides beyond the top-side of the supporting part. During assembly, the printed circuit board is guided between the top-side and the protruding spring legs. The printed circuit board is fixed by additional supporting parts of the device.

15 Claims, 3 Drawing Sheets

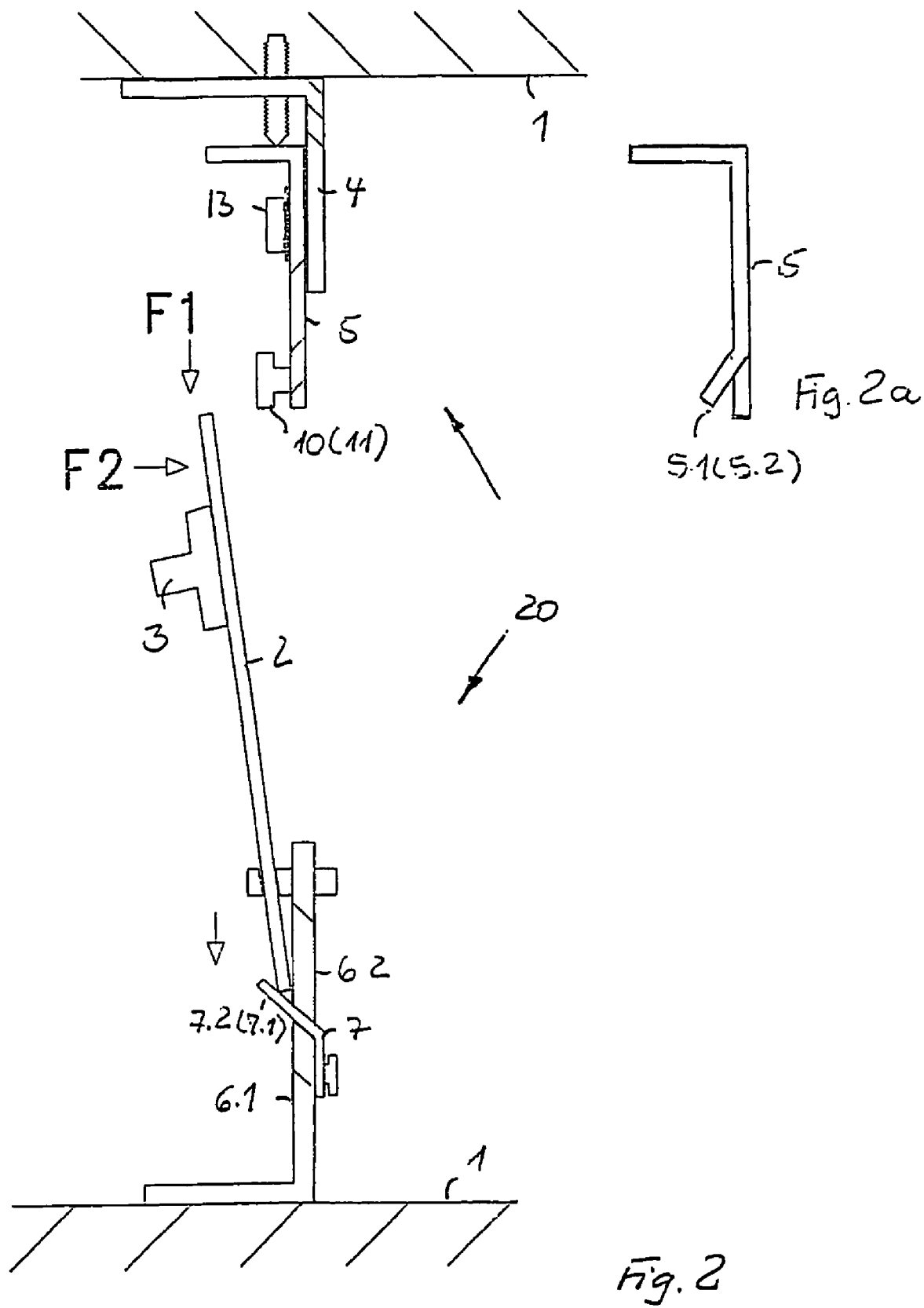

ASSEMBLING/DISASSEMBLING AND FIXING A PRINTED CIRCUIT BOARD

This nonprovisional application claims priority to International Application PCT/EP2003/006967, which was filed on Jul. 1, 2003, and which claims priority to German Patent Application No. DE 102 31 714.3, which was filed in Germany on Jul. 13, 2002, and which are both herein incorporated by reference.

BACKGROUND OF THE INVENTION

1. Field of the Invention

The present invention relates to a device for assembling/disassembling and fixing of a printed circuit board, particularly in a line mounting plate of an inspection apparatus.

2. Description of the Background Art

It is commonly known that the positioning (fine adjustment) as well as the assembly of a printed circuit board with line sensors in a line mounting plate is time-consuming because the printed circuit board has to be spatially fixed in a defined position to a fan-shaped light or x-ray beam. During installation, the printed circuit board is tightly screwed with screws, via the mounting bores positioned around its sides, to a front and rear metal bearing surface, which is slidable in a Y-direction. In turn, these metal bearing surfaces are each positioned flush against a rigid front and rear metal guide surface of the line mounting plate, the metal guide surfaces having angled ends, and are fixed in an X-direction by punched-out elongated holes and guide bolts. In a Z-direction, the fixing is done on the front (of the printed circuit board side where the sensors are located) with an initially loosely mounted screw with several spring-loaded U-disks, which cause the printed circuit board to be pressed against a rigid metal sheet. Then the rear part, which does not have any sensors, is pressed against a rear, rigidly positioned metal bearing surface by a mounting screw using a special die-cut part that is made of phosphorous bronze metal. The front is provided with an adjustment/set-screw, with which during the adjusting process either a tightening or a pressure force is applied in both Y-directions to the slidable front metal bearing surface. After completion of the fine adjustment, the still loose mounting screw is tightened with the spring-loaded press-on disks.

SUMMARY OF THE INVENTION

It is therefore an object of the present invention to provide a device that reduces the assembly/disassembly expenditure for a printed circuit board in a holding device.

The invention is based on the idea to not use one of the support elements of a holding device for fixing, and instead integrate a specially shaped spring in the device/holding device. This simplifies the assembly (disassembly) of a printed circuit board because it only has to be pressed against the spring and a stationary support element of the holding device. In order to be able to press the printed circuit board, for example, vertically, against the stationary support element, a specially designed leg spring is fastened below the stationary support element. The legs of the leg spring extend on both sides beyond the top of the support element. The forces necessary for assembly and adjustment are generated by the spring, through which the printed circuit board is then fixed into place in all three directions.

In a further embodiment of the invention, a bearing surface of the printed circuit board that is free of components and conductive strips is provided, which serves as a bearing and sliding surface. The stationary support element is of a defined length so that it protrudes with sufficient length below the printed circuit board.

Preferably, a circumference of the printed circuit board itself is provided with millcuts or the like. To guide the printed circuit board in a Y-direction, at least two millcut elongated holes are provided in the area of its bearing surface, with which the pins of the stationary support element can engage when the printed circuit board is installed.

To fix the printed circuit board to the opposite remaining support elements of the holding device during assembly, one stationary and at least one slidable support element, two guide bolts or lugs of the slidable support part, the lugs transversely being bent upward in the metal bearing surface, engage with additional millcuts of the printed circuit board.

The mounting of the slidable support element to the stationary support element is done by tightening a bolt of the stationary support element, which engages through an elongated hole in the slidable support element.

Apart from the adjustment time, the proposed device also reduces the tolerances of traditional installation locations. The assembly as well as the disassembly of the printed circuit board in the holding device is accomplished without tools. Nevertheless, the printed circuit board can be fixed into place with greater precision and zero play.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 is a side-view illustrating the insertion of the printed circuit board of FIG. 1 into the holding device;

FIG. 2a is a variation of FIG. 2;

DETAILED DESCRIPTION

Figure 1:
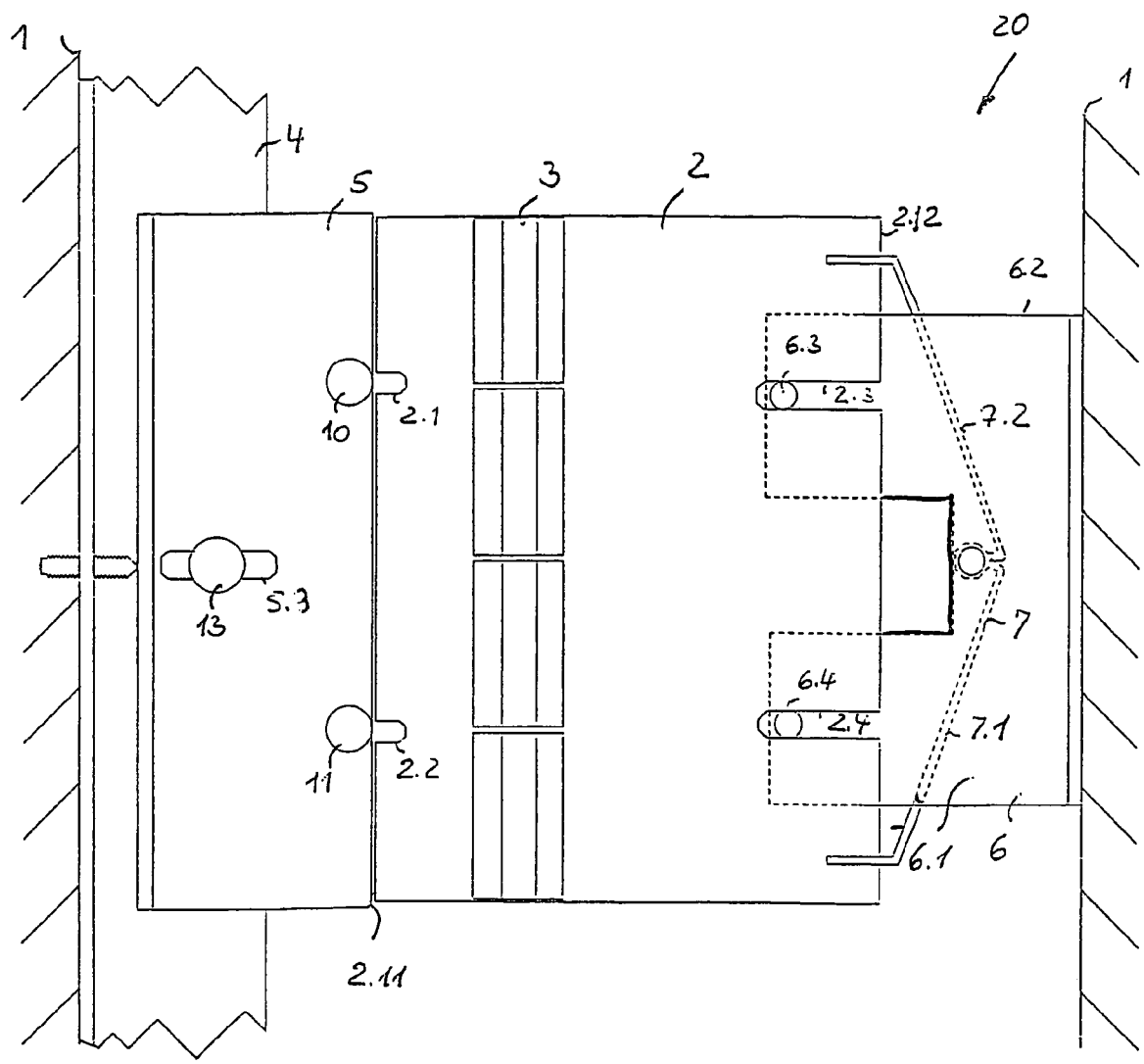
FIG. 1: is a top-view illustration of a device having a printed circuit board in a holding device according to a preferred embodiment of the present invention.

FIG. 1 illustrates in one view an assembly/disassembly device 20 of an inspection apparatus (not actually shown) that is integrated in a line mounting plate 1, with a printed circuit board 2 and line sensors 3 located thereon.

In this illustration, the device 20 has on its left side a rear metal guide sheet 4 affixed to the mounting plate 1 as well as a slidable front metal guide sheet 5 located thereupon, and on its right side, it has an additional metal guide sheet 6 affixed to the mounting plate 1. On the underside 6.2 of the metal guide sheet 6, a spring 7 is attached as part of the assembly/disassembly device 20, the legs 7.1 and 7.2 of which extend beyond the upper side 6.1 of the metal guide sheet surface, both to the right and to the left. The attachment point (location) of the spring 7 is determined by the force-gathering point in the middle.

The printed circuit board 2 has a bearing surface that is free of components and conductive strips, the bearing surface serving as a bearing and a sliding surface, and has in this area on its outer periphery 2.12 two larger U-shaped millcuts, that is, guide grooves 2.3, 2.4. In addition, two smaller millcuts 2.1, 2.2 are provided on the opposite side 2.11. The larger guides 2.3, 2.4 interact with guide pins 6.3, 6.4 of the metal guide sheet 6, (whereas) the smaller millcuts 2.1, 2.2 interact with two mushroom-shaped bolts 10, 11 or with two lugs 5.1, 5.2 (FIG. 2*a*) of the metal guide sheet 5, the lugs being transversely bent upwards.

The upper metal guide sheet 5 has an elongated hole 5.3, through which a bolt 13 of the lower metal guide sheet 4 extends, and the upper metal guide sheet 5 is movably superposable against the stationary metal guide sheet 4.

FIG. 2 shows the insertion of the printed circuit board 2 into the holding device 1.

To do this, the printed circuit board 2 is inserted below the spring legs 7.1, 7.2, but above the metal guide sheet 6 and is pressed in the direction of the metal guide sheet 6, whereby the guide pins 6.3, 6.4 (or die-cut embossings) protruding from the metal guide sheet 6 engage with or through the guide grooves 2.3, 2.4. In this state of assembly, the printed circuit board 2 presses permanently against the two bent ends of the spring legs 7.1, 7.2 in a Y-direction, thus tensioning the spring 7. In turn, the static force of the spring presses the printed circuit board 2 with equal counter force in a Y-direction. Simultaneously, the printed circuit board 2 is pressed by an additional force, which is primarily derived from the angle of incidence α of the ends of spring 7, in a Z-direction, that is, onto the surface (upper side 6.1) of the metal guide sheet 6. The necessary counter force for the spring 7 in a Z-direction is generated on those two locations on the underside 6.2 of the metal guide sheet 6 where the spring legs 7.1, 7.2 extend beyond the outer boundaries.

To fix the other side 2.11 of the printed circuit board 2 into place, the two mushroom-shaped bolts 10, 11 on the front metal guide sheet 5, or the transversely bent-up metal lugs 5.1, 5.2 of the metal guide sheet 5 click into the two millcuts 2.1, 2.2 during installation. By tensioning the spring 7 and the fixing thereof, the front bearing surface of the printed circuit board 2 is initially fixed in the two X- and Z-directions. Due to the tensioned spring 7, the printed circuit board 2 is simultaneously in a Y-direction against the bolts 10, 11 (or transverse metal lugs 5.1, 5.2), and is thus permanently adjusted in this direction. The adjustment is free of play due to parallel translatory movement of the printed circuit board 2. To fasten the metal guide sheet 5 to the metal guide sheet 4, the bolt 13 is tightened.

Figure 3A:
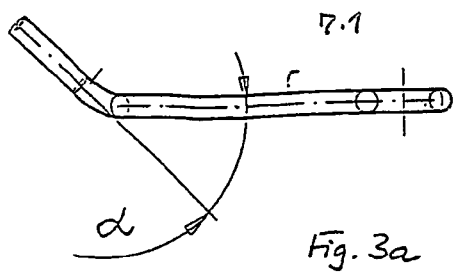
FIG. 3a is an illustration of the spring in direction A of FIG. 3.
Figure 3B:
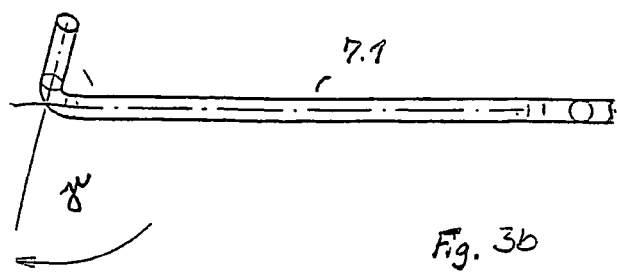
FIG. 3b is a partial illustration of the spring in direction B of FIG. 3.
Figure 3:
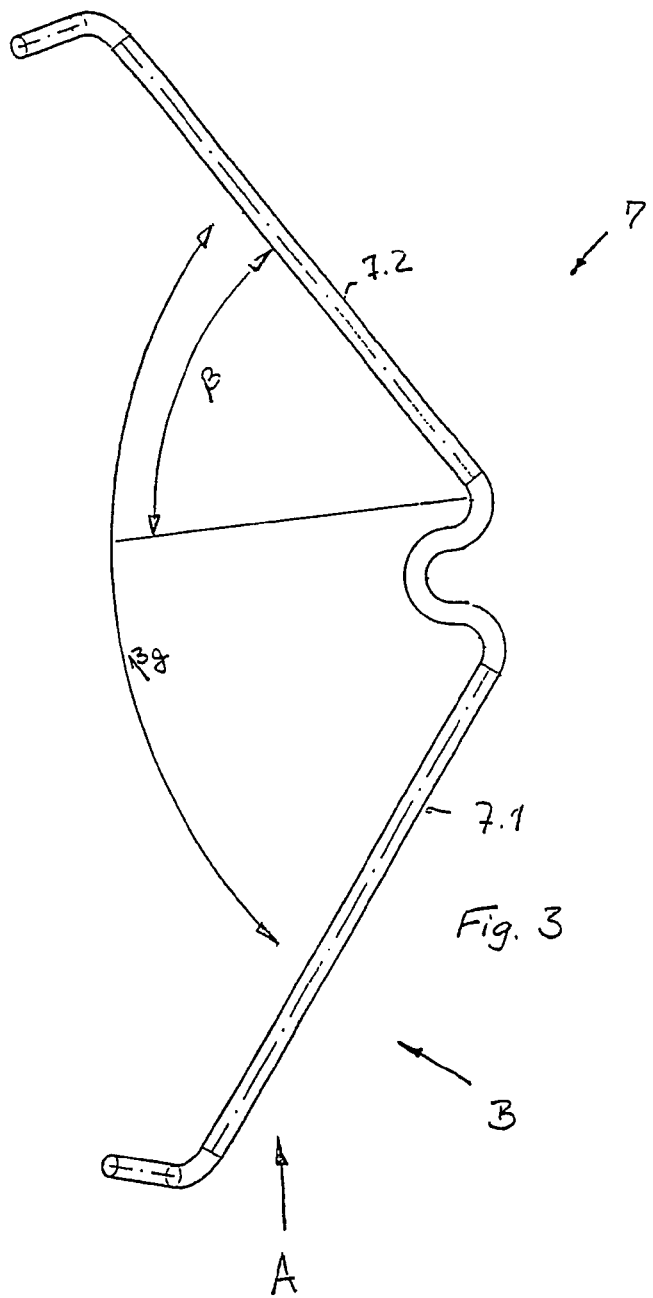
FIG. 3 is a top-view illustration of a spring shown in FIG. 1.

A possible embodiment of the spring 7 is illustrated in FIG. 3, whereby in FIG. 3*a*, the spring 7 is shown in a view direction A, and in FIG. 3*b*, the spring 7 is shown in a view direction B of the spring 7 in FIG. 3. Preferably, the spring is made of spring steel wire, with a diameter of about 1,5 mm. In a preferred embodiment, the legs 7.1, 7.2 have a spreading angle β of about 55° each. The angle of incidence α on the ends of spring 7 is about 44°, which in themselves are bent by an additional angle χ of about 75°, as shown in FIG. 3*b*. Preferably, the length of the two ends of the spring legs 7.1, 7.2, which put force on the printed circuit board 2, is preferably about 5 mm.

With this preferred embodiment and a defined transverse position of the spring legs 7.1, 7.2 to the metal guide sheet 6, the required forces are generated. It goes without saying that the stated measurement can be varied.

The device is not limited to the assembly/disassembly of a printed circuit board in a line mounting plate of an inspection apparatus. It can also be assembled, and function, on its own, by integrating equivalent support elements.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device for facilitating assembling, disassembling, and fixing a printed circuit board, the device comprising:
   support elements including:
   a first stationary support element
   a slidable support element, which is slidable against the first stationary support element, and
   a second stationary support element that is located opposite the first stationary support element, wherein the support elements are configured to fix a printed circuit board therebetween, and
   a leg spring having ends, the leg spring being fastened to a lower side of the second stationary support element, ends of the leg spring being formed so as to extend beyond an upper surface of the second stationary support element so that the leg spring is configured to exert a force against the printed circuit board for pressing the printed circuit board substantially towards the slidable support element and substantially towards the upper surface of the second stationary support element.

2. The device according to claim 1, wherein the printed circuit board has a bearing surface area that is free of components as well as of conductive strips.

3. The device according to claim 1, further comprising guide bolts or transversely bent-up metal lugs being provided on the slidable support element, wherein the guide bolts or transversely bent-up metal lugs are configured to engage with a printed circuit board having millcuts on a side thereof.

4. The device according to claim 1, wherein the support elements are metal guide sheets.

5. The device according to claim 1, wherein sensors are located on an upper side of the printed circuit board, which is opposite to a bearing surface area of the printed circuit board.

6. The device according to claim 1, wherein the ends of the spring legs have an angle of incidence (α).

7. The device according to claim 1, wherein the spring legs each include a spreading angle (β).

8. The device according to claim 1, wherein the leg spring is made of spring steel.

9. The device according to claim 1, wherein the first and second stationary support elements are mounted to a line mounting plate of an inspection apparatus.

10. The device according to claim 6, wherein the ends of the spring legs are additionally bent by an angle (χ) against the angle of incidence (α).

11. A device for facilitating assembling, disassembling, and fixing a printed circuit board, the device comprising:
   the printed circuit board, wherein the printed circuit board has a bearing surface area that is free of components as well as of conductive strips;
   support elements including:
   a first stationary support element,
   a slidable support element, which is slidable against the first stationary support element, and a second stationary support element that is located opposite the first stationary support element such that the printed circuit board is fixed therebetween, and a leg spring having ends, the leg spring being fastened to a lower side of the second stationary support element, ends of the leg spring being formed so as to extend beyond an upper surface of the second stationary support element so that a force, which is exerted from the leg spring, presses the printed circuit board substantially towards the slidable support element and substantially towards the upper surface of the second stationary support element, wherein, in an area of the bearing surface, the printed circuit board is provided with at least two elongated holes, which interact with pins or stamped protrusions that are located on the upper side of the second stationary support element.

12. A device for fixedly and removably holding a printed circuit board between line mounting plates of an x-ray apparatus, the device comprising:

a first and second support plate, each being fixedly attached to one of the line mounting plates;

a guide plate that is slidably mounted to the first support plate such that a lower surface of the guide plate slidably engages an upper surface of the first support plate;

a leg spring being attached at an attachment area to a lower surface of the second support plate, the leg spring having a first leg and a second leg extending from the attachment area such that end portions of the first leg and second leg extend beyond edges of the second support plate so that a portion of the printed circuit board, in an installed state, is positioned between a portion of the end portions of the first and second leg and an upper surface of the second support plate, the upper surface of the second support plate being opposite to the lower surface of the second support plate, wherein the leg spring exerts a force onto the printed circuit board so that a lower surface of the printed circuit board engages the upper surface of the second support plate and so that an edge of the printed circuit board engages guide elements of the guide plate, and wherein the guide elements are positioned on the guide plate such that the printed circuit board is fixedly held in a predetermined position between the line mounting plates so that line sensors, which are provided on an upper surface of the printed circuit board, sense an x-ray beam.

13. A device for removably holding a printed circuit board comprising:

a first support having first and second opposed sides;

a second support spaced from said first support and having first and second opposed sides and a peripheral edge;

a leg spring having a central portion mounted on an attachment area on the second side of the second support, the leg spring having a first leg having an end and a second leg having an end, said first and second ends projecting beyond said peripheral edge and beyond said second support first side;

whereby, said first and second legs hold the printed circuit board against the first side of said second support when a portion of the printed circuit board extends between the first and second leg ends and the second support first side.

14. The device of claim 13 further including a guide plate slidably mounted on the first support.

15. The device of claim 14 further including at least one guide member on said guide plate and at least one guide element on said second support, said at least one guide member and said at least one guide element being configured to engage parts of the printed circuit board.

* * * * *

UNITED STATES PATENT AND TRADEMARK OFFICE
CERTIFICATE OF CORRECTION

PATENT NO. : 7,692,934 B2  
APPLICATION NO. : 11/033115  
DATED : April 6, 2010  
INVENTOR(S) : Bartscher et al.

Page 1 of 1

It is certified that error appears in the above-identified patent and that said Letters Patent is hereby corrected as shown below:

On the Title Page, please add the following priority data:

(30) Foreign Application Priority Data

July 13, 2002 (DE) ...... 102 31 714.3

Domestic Priority Data

This application is a CON of PCT/EP03/06967 filed July 1, 2003

Please change the following:

(74) *Attorney, Agent, or Firm* – Muncy, Giessler, Olds & Lowe, PLLC

To:

(74) *Attorney, Agent, or Firm* – Muncy, Geissler, Olds & Lowe, PLLC

Signed and Sealed this  
Thirteenth Day of March, 2012

David J. Kappos  
*Director of the United States Patent and Trademark Office*